United States Patent
Fujiwara

(10) Patent No.: US 9,336,163 B2
(45) Date of Patent: May 10, 2016

(54) PRECHARGE CONTROL FOR MEMORY BANK COMMANDS

(71) Applicant: CANON KABUSHIKI KAISHA, Tokyo (JP)

(72) Inventor: Makoto Fujiwara, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 258 days.

(21) Appl. No.: 14/018,855

(22) Filed: Sep. 5, 2013

(65) Prior Publication Data

US 2014/0122789 A1 May 1, 2014

(30) Foreign Application Priority Data

Oct. 31, 2012 (JP) ................. 2012-241103

(51) Int. Cl.
| | |
|---|---|
| G06F 12/00 | (2006.01) |
| G06F 13/16 | (2006.01) |
| G06T 1/60 | (2006.01) |
| G11C 7/10 | (2006.01) |
| G06F 12/04 | (2006.01) |
| G09G 5/36 | (2006.01) |
| G11C 8/12 | (2006.01) |
| G01R 31/317 | (2006.01) |

(52) U.S. Cl.
CPC ........ *G06F 13/1621* (2013.01); *G06F 13/1642* (2013.01); *G06T 1/60* (2013.01); *G01R 31/3171* (2013.01); *G06F 12/04* (2013.01); *G06F 13/1636* (2013.01); *G09G 5/363* (2013.01); *G11C 7/1006* (2013.01); *G11C 8/12* (2013.01)

(58) Field of Classification Search
CPC . G06F 13/1636; G06F 13/1621; G06F 12/02; G06F 12/00; G06F 12/10
See application file for complete search history.

(56) References Cited

U.S. PATENT DOCUMENTS

| | | | | |
|---|---|---|---|---|
| 6,751,712 B2* | 6/2004 | Iizuka | ............................ | 711/154 |
| 7,280,428 B2* | 10/2007 | Ware | ........................ | G11C 8/12 |
| | | | | 365/189.04 |
| 7,562,184 B2* | 7/2009 | Henmi | .................... | G09G 5/363 |
| | | | | 345/531 |
| 2006/0117155 A1* | 6/2006 | Ware | .................... | G11C 7/1006 |
| | | | | 711/163 |
| 2007/0047362 A1* | 3/2007 | Kuwabara | ........... | G06F 13/1636 |
| | | | | 365/222 |
| 2007/0220218 A1* | 9/2007 | Kato | ............................. | 711/154 |
| 2010/0030980 A1* | 2/2010 | Yamada | .................... | G06T 1/60 |
| | | | | 711/157 |
| 2010/0036997 A1* | 2/2010 | Brewer | .................. | G06F 12/04 |
| | | | | 711/5 |
| 2011/0035559 A1* | 2/2011 | Asai | .................... | G06F 13/1642 |
| | | | | 711/154 |
| 2011/0238870 A1* | 9/2011 | Ware | .................. | G01R 31/3171 |
| | | | | 710/35 |

FOREIGN PATENT DOCUMENTS

JP   2007-249837 A   9/2007

* cited by examiner

*Primary Examiner* — Hal Schnee
*Assistant Examiner* — Tahilba Puche
(74) *Attorney, Agent, or Firm* — Fitzpatrick, Cella, Harper & Scinto

(57) ABSTRACT

In a memory control apparatus for issuing a command for a bank corresponding to a transfer request, the transfer request for the corresponding bank is stored. The column address of the transfer request stored at the first is compared with the column addresses of a plurality of subsequent transfer requests. It is determined based on the comparison result whether to issue a command with precharge or a command without precharge for the transfer request stored at the first. The determined command is issued.

15 Claims, 9 Drawing Sheets

FIG. 8A

1. ACTIVE
↓
2. READ
↓
3. PRE
↓
4. ACTIVE
↓
5. WRITE
↓
6. PRE
↓
7. ACTIVE
↓
8. WRITE
↓
9. PRE
↓

FIG. 8B

1. ACTIVE
↓
2. READ A
↓
4. ACTIVE
↓
5. WRITE A
↓
7. ACTIVE
↓
8. WRITE A
↓

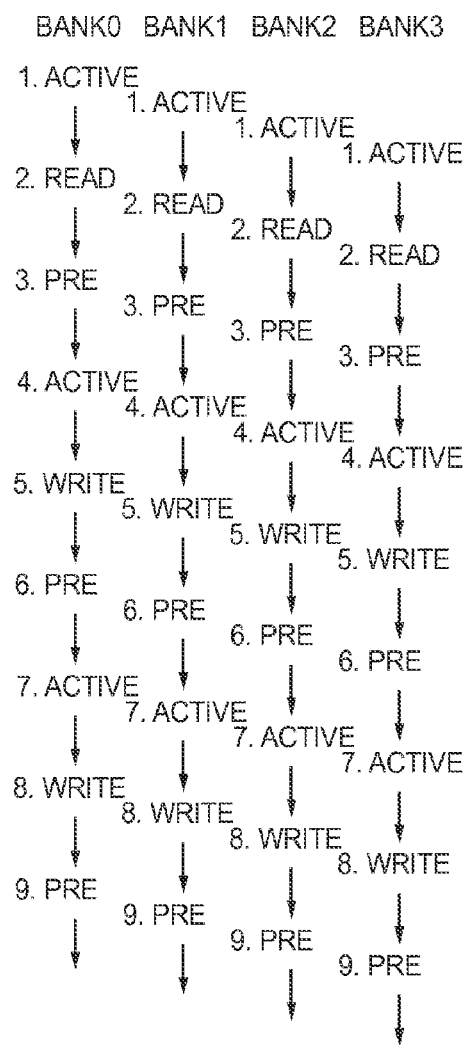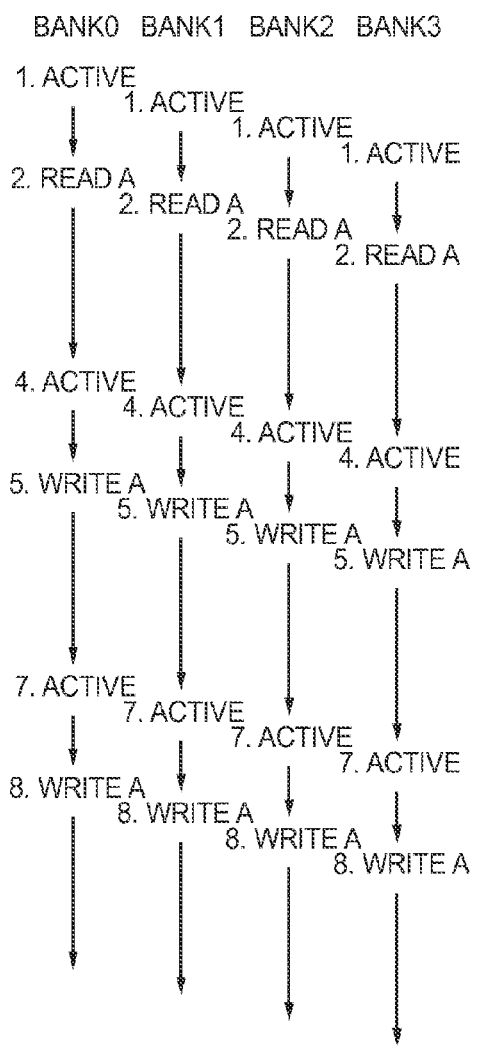

US 9,336,163 B2

PRECHARGE CONTROL FOR MEMORY BANK COMMANDS

BACKGROUND OF THE INVENTION

1. Field of the Invention

The present invention relates to a memory control apparatus for controlling a memory access command to be used and a memory control method.

2. Description of the Related Art

As the main memory of a computer system, a synchronous DRAM is used in general. Along with the improvement of functionality and performance of computer systems, requirements for the access performance of the synchronous DRAM are growing. To make the most of the performance, various methods for controlling access to the synchronous DRAM have been proposed concerning a memory control apparatus.

When independently controlling memory access to a plurality of banks of a synchronous DRAM, the issuance timings of a plurality of commands overlap in some cases. Since the specifications of the synchronous DRAM do not permit issuance of the plurality of commands at the same timing, the issuance of any one of the commands needs to be delayed.

In Japanese Patent Laid-Open No. 2007-249837, the column address of the current memory transfer is compared with the column address of the next memory transfer. If the column addresses are different, a READ A command (READ command with precharge) or a WRITE A command (WRITE command with precharge) is issued. On the other hand, if the column addresses are identical, READ commands or WRITE commands of the same column address are continuously issued.

According to the method disclosed in Japanese Patent Laid-Open No. 2007-249837, however, the column address of the current memory transfer is compared with the column address of the next memory transfer but not with the memory transfer address after next. Hence, if transfer of the same column address exists after next the transfer for issuing a command, a READ A command or a WRITE A command is used. In this case, if the next transfer is done for a different bank, access can be performed without precharge. Hence, unnecessary precharge occurs, and the transfer efficiency lowers.

SUMMARY OF THE INVENTION

The present invention has been made in consideration of the above-described problem, and improves memory access performance by adaptively controlling issuance of a command to perform precharge.

According to a one aspect of the present invention, there is provided a memory control apparatus for issuing a command to control a memory including a plurality of banks, comprising: a command control unit configured to, based on an input transfer request, issue a command for a bank corresponding to the transfer request, the command control unit comprising: a transfer request storage unit configured to store the transfer request for each bank; a transfer request comparison unit configured to compare a column address of the transfer request stored at a first of the transfer request storage unit with column addresses of a plurality of subsequent transfer requests; a command determination unit configured to determine based on a comparison result of the transfer request comparison unit whether to issue a command with precharge or a command without precharge for the transfer request stored at the first of the transfer request storage unit; and a command issuance unit configured to issue the command determined by the command determination unit.

Further features of the present invention will become apparent from the following description of exemplary embodiments (with reference to the attached drawings).

BRIEF DESCRIPTION OF THE DRAWINGS

FIG. 8A is a view for explaining a memory access procedure by a READ command and a WRITE command;

FIG. 8B is a view for explaining a memory access procedure by a READ A command and a WRITE A command;

FIG. 9A is a view for explaining a memory access procedure for a 4-bank memory by a READ command and a WRITE command; and FIG. 9B is a view for explaining a memory access procedure for a 4-bank memory by a READ A command and a WRITE A command.

DESCRIPTION OF THE EMBODIMENTS

First Embodiment

Figure 7:
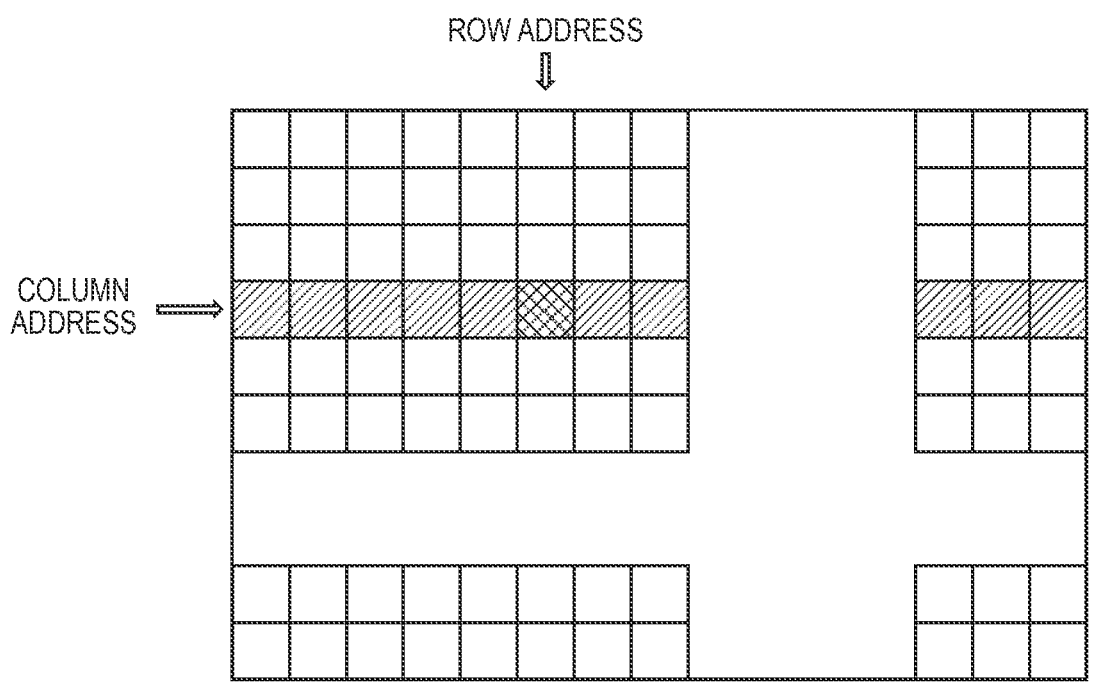
FIG. 7 is a view for explaining the arrangement of a synchronous DRAM.

A synchronous DRAM used in this embodiment will be described. The synchronous DRAM includes a number of memory elements arranged in a grid, as shown in FIG. 7, and specifies an access target memory element by a combination of a row address and a column address input from the outside. FIG. 7 shows a state in which memory elements indicated by hatching are specified. Data input and output for the synchronous DRAM are done by causing the memory control apparatus to issue commands to be described below. The commands include:

(A) an ACTIVE command to specify and activate a column address;
(B) a READ command to specify a row address and instruct data output;
(C) a WRITE command to specify a row address and instruct data storage;
(D) a PRE command to perform inactivation (precharge);
(E) a READ A command to specify a row address, output data, and after the data output, automatically perform precharge; and
(F) a WRITE A command to specify a row address, store data, and after the data storage, automatically perform precharge. There also exist a REFRESH command to instruct refresh to the synchronous DRAM, and the like.

Data read from the synchronous DRAM can be implemented using the above-described commands in the following way. That is, (1) a column address is specified by the ACTIVE command, and
(2) a row address is specified by the READ command to output data. To write data in the synchronous DRAM, (1) a column address is specified by the ACTIVE command, and (2) a row address is specified by the WRITE command to store data.

At this time, when continuously accessing memory elements corresponding to the same column address, like the memory elements indicated by hatching in FIG. 7, the ACTIVE command of (1) can be omitted in the second and subsequent read or write. The next READ command or WRITE command can be issued following the immediately preceding READ command or WRITE command. Hence, as a characteristic feature of the synchronous DRAM, high-speed memory access can be performed when continuously accessing memory elements on the same column address.

On the other hand, when accessing a memory element on a column address different from that of the immediately preceding memory access, the column address is temporarily be inactivated by issuing the PRE command. After that, the ACTIVE command is issued to activate the different column address, and READ or WRITE is executed. That is, following (1) and (2) described above, (3) inactivation is instructed by the PRE command, (4) the different column address is specified by the ACTIVE command, and (5) data read or write is performed by the READ command or WRITE command.

Hence, when continuously accessing different column addresses using the READ command and the WRITE command, the memory control apparatus needs to issue a command sequence shown in FIG. 8A. That is, the PRE command and the ACTIVE command are necessary between the READ command and the WRITE command and the number of commands increases. For such memory access, the READ A command and the WRITE A command to automatically perform precharge are used to decrease the number of commands as shown in FIG. 8B, thereby implementing the same access as in FIG. 8A. That is, since PRE command issuance can be omitted, the number of commands to be issued can be decreased as compared to the case in which the READ command and the WRITE command are used.

The synchronous DRAM is divided into units called banks in addition to the column addresses and row addresses, and memory access to the respective banks can be performed independently. When continuously accessing different column addresses of different banks using the READ command and the WRITE command, the memory control apparatus needs to issue a command sequence shown in FIG. 9A. For such memory access, the READ A command and the WRITE A command are used, as in FIG. 8B, thereby decreasing the number of commands to be issued, as shown in FIG. 9B.

Figure 1:
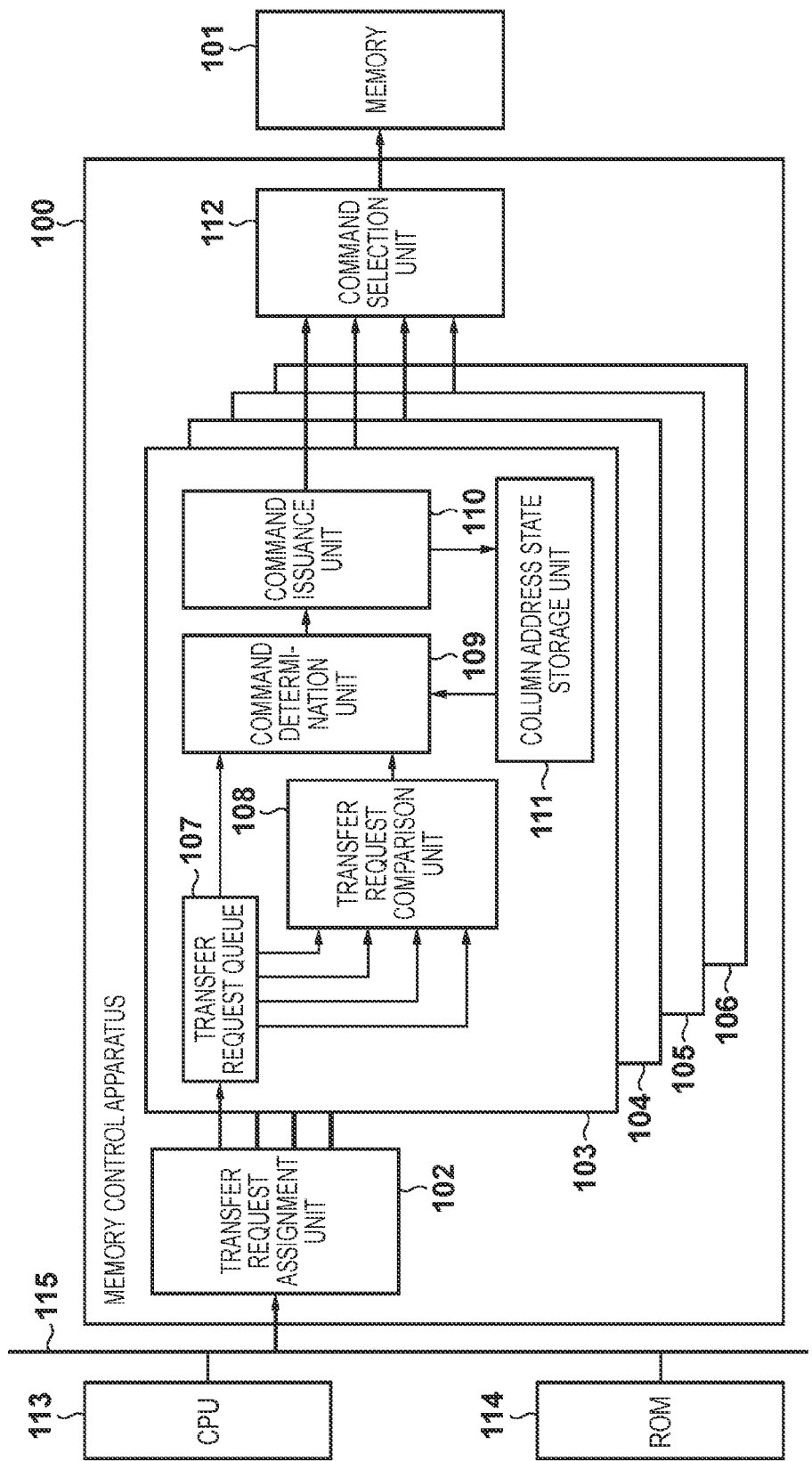
FIG. 1 is a block diagram showing the arrangement of a memory control apparatus.

This embodiment will be described next. FIG. 1 is a block diagram for explaining an information processing apparatus according to this embodiment, and illustrates the schematic arrangement of a memory control apparatus 100. The memory control apparatus 100 receives a memory transfer request from an external CPU 113 or the like, and accesses the memory based on the request by issuing commands to a memory 101 that is a synchronous DRAM. A transfer request assignment unit 102 assigns the received memory transfer request to command control units 103 to 106 prepared for the banks (banks 0 to 3) to access. The assignment is done based on information obtained by decoding address information included in the memory transfer request. The command control units 103 to 106 have the same arrangement. The command control unit 103 that processes a transfer request assigned to bank 0 will be explained here. Note that the CPU 113 issues the memory transfer request through a system bus 115 in accordance with a program held in a ROM 114 or a program corresponding to the contents of the ROM 114 extracted to the memory 101. In the memory control apparatus 100 shown in FIG. 1, only command paths are illustrated, and data paths are not illustrated.

The transfer request assigned to each bank (in this case, bank 0) is temporarily stored in a transfer request queue (command queue) 107 in the command control unit. In the example shown in FIG. 1, the transfer request queue has four stages and can receive four transfer requests and sequentially hold them by FIFO. A transfer request comparison unit 108 compares the column address of the access destination included in the first transfer request stored in the transfer request queue 107 that is a transfer request storage unit with the column address of the access destination included in each of the subsequent transfer requests. Hence, in the example shown in FIG. 1, the transfer request comparison unit 108 includes three comparators each capable of comparing a column with the first column address. After that, the transfer request comparison unit 108 outputs the presence/absence of the same column address to a command determination unit 109 as a comparison result.

A column address state storage unit 111 of each of the command control units 103 to 106 monitors commands issued by a command issuance unit 110, stores the selection state (column address, precharge state, and the like) of the current column address for the bank corresponding to the local command control unit, and outputs the selection state to the command determination unit 109. Note that an active column in the selection state is called a page. The command determination unit 109 receives request information stored at the first from the transfer request queue, and determines the command to be output based on the information, the comparison result input from the transfer request comparison unit 108, and the selection state input from the column address state storage unit 111. The determination result is output to the command issuance unit 110. The command issuance unit 110 issues a command based on the determination result input from the command determination unit 109. A command selection unit 112 selects one of the commands output from the command control units 103 to 106 for the respective banks in accordance with a predetermined rule, and issues the selected command to the memory 101. The rule is supposedly decided based on, for example, a priority order fixed for each bank.

Although the memory control apparatus 100 shown in FIG. 1 has been described while focusing on the commands of memory access, a buffer for data input/output and the like are also provided, as a matter of course. Note that an arbitration unit that decides the priority order of a transfer request may be disposed at the preceding stage of the transfer request assignment unit 102 but is not illustrated because it is not directly relevant to the gist of the present invention. Note that FIG. 1 shows an example in which the number of banks is four, and the number of command control units is four. The number of command control units can be set in accordance with the number of banks. As the number of transfer requests to be stored in the transfer request queue 107, a natural number can be set.

Figure 2:
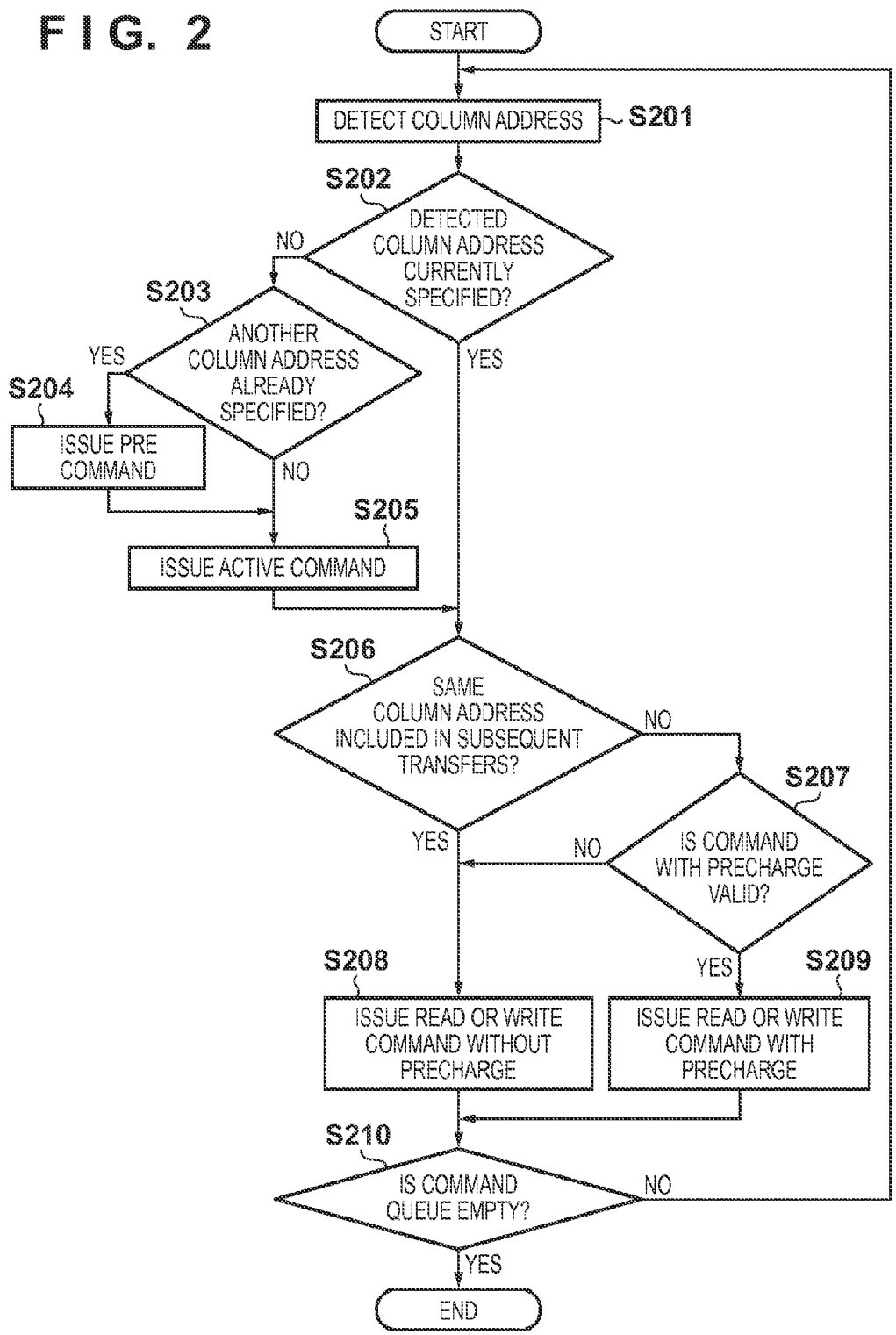
FIG. 2 is a flowchart showing the procedure of processing of a command issuance control unit.

FIG. 2 is a flowchart showing processing executed by the command control units 103 to 106 according to this embodiment. The command determination unit 109 detects a column address using request information stored at the first of the transfer request queue 107 (step S201). The command determination unit 109 determines based on selection state information input from the column address state storage unit 111 whether the detected column address is currently specified (active) (step S202). If the column address is not specified (NO in step S202), the command determination unit 109 confirms based on the selection state information input from the column address state storage unit 111 whether a column address is currently selected (step S203). When a column address is selected (YES in step S203), a column address different from the column address to be accessed next has been specified. Hence, the command issuance unit 110 issues the PRE command (step S204). The command issuance unit 110 subsequently issues the ACTIVE command to specify the column address (step S205). In a precharge state in which no other column address is specified (NO in step S203), the command issuance unit 110 issues not the PRE command but only the ACTIVE command (step S205). Specifying the column address to be accessed next is completed by the steps described above.

When specifying the column address to be accessed next is completed, the command determination unit 109 outputs the column address to the transfer request comparison unit 108. The transfer request comparison unit 108 compares all the subsequent transfers stored in the transfer request queue 107 (step S206). If the column addresses of the subsequent transfer requests includes the same column address as the column address to be accessed next (YES in step S206), memory access is performed by issuing the READ or WRITE command not to automatically perform precharge (without precharge) (step S208). If the column addresses of the subsequent transfer requests do not include the same column address (NO in step S206), it is confirmed whether a setting to use a command with precharge is valid (step S207). If the setting is not valid (NO in step S207), memory access is performed by issuing the READ or WRITE command not to automatically perform precharge (step S208). If the setting to use a command with precharge is valid (YES in step S207), memory access is performed by issuing the READ A or WRITE A command to automatically perform precharge (step S209). It is determined whether the transfer request queue (command queue) 107 is empty. If the transfer request queue 107 is not empty (NO in step S210), the process returns to step S201. If the transfer request queue 107 is empty (YES in step S210), the processing ends.

The plurality of command control units provided for the respective banks execute the above-described processing of the command control unit in parallel. As a means for determining whether the setting to use the command with precharge is valid, attribute information representing valid/invalid of the command with precharge may be received for each transfer request, and the determination may be based on the attribute information. Alternatively, an operation mode setting unit may be provided in the memory control apparatus, and decision may be done based on the setting of software.

As described above, in this embodiment, a plurality of transfer requests stored in the transfer request queue in each bank are compared. This makes it possible to issue the READ or WRITE command even for transfer to different banks. It is therefore possible to suppress occurrence of unnecessary precharge and prevent the transfer efficiency from lowering. Note that in the first embodiment, the transfer request assignment unit 102 causes the transfer request queue 107 to hold transfer requests for each bank. Hence, if access to each bank is guaranteed to be executed in the order of storage in the transfer request queue 107, only the address of the immediately subsequent transfer request may be confirmed in step S207.

Second Embodiment

A function of burst termination is implemented in a DRAM to reduce unnecessary memory access to the DRAM when the data amount in one memory transfer is smaller than the burst transfer unit of the DRAM. For example, in a DRAM of DDR2 specifications, the READ command or WRITE command can use the termination function, though burst termination for the READ A command or WRITE A command is prohibited. Hence, although the total number of command issuances can be decreased by using the READ A command or WRITE A command, burst termination is impossible. In this embodiment, using a command with precharge for the READ command or WRITE command that does not need burst termination will be examined.

Figure 3:
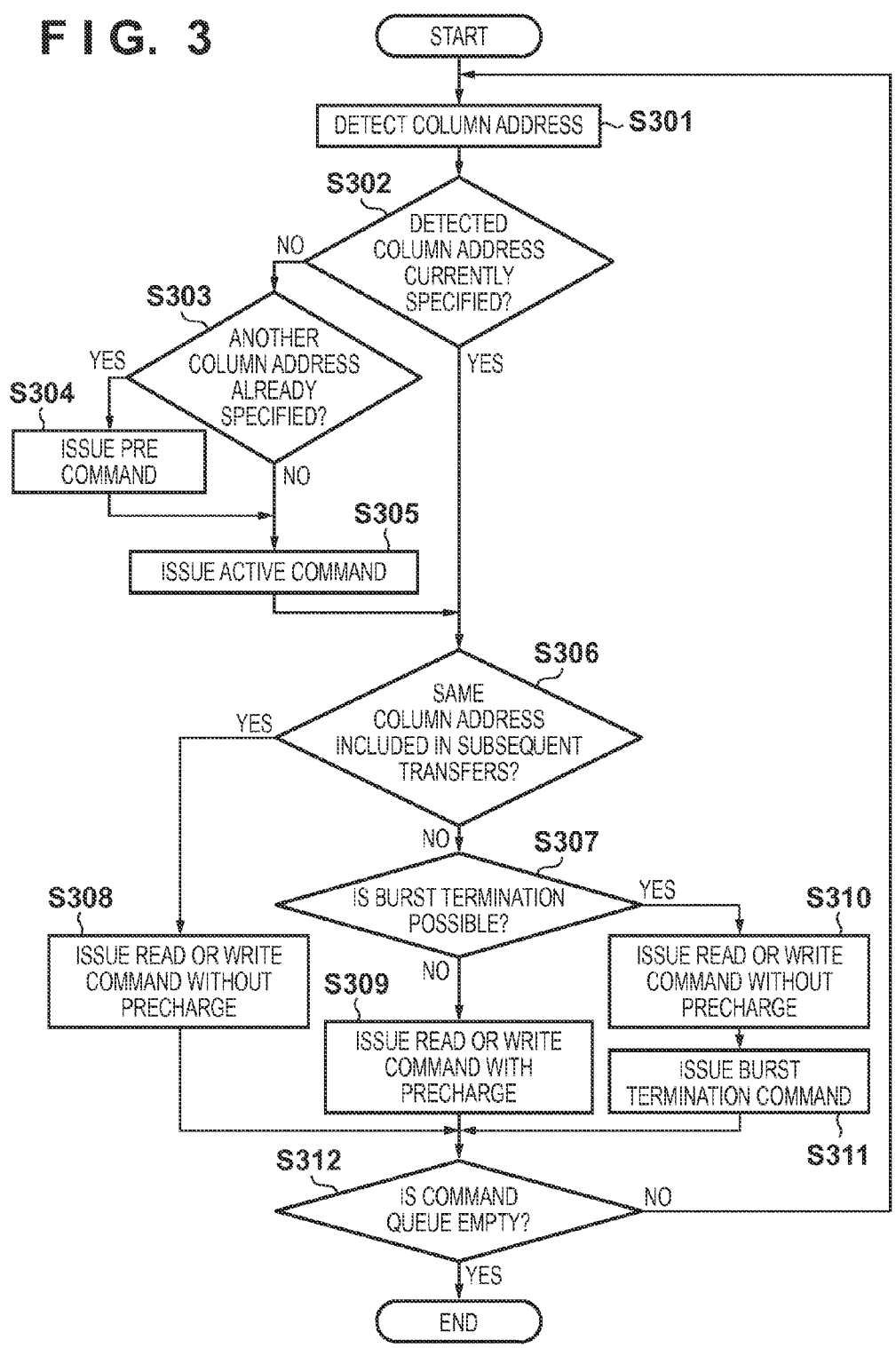
FIG. 3 is a flowchart showing the procedure of processing of a command issuance control unit.

FIG. 3 is a flowchart showing processing executed by command control units 103 to 106 according to this embodiment. Steps S301 to S305 of FIG. 3 are the same processes as steps S201 to S205 of FIG. 2, respectively. Processing from step S306 is different from the first embodiment. Hence, processing from step S306 will be described. When specifying the column address is completed, subsequent transfers stored in a transfer request queue 107 are confirmed (step S306). If the column addresses of the subsequent transfer request include the same column address as the column address to be accessed next (YES in step S306), memory access is performed by issuing the READ or WRITE command not to automatically perform precharge (step S308). If the column addresses of the subsequent transfer requests do not include the same column address (NO in step S306), it is confirmed whether burst termination is possible for the memory access to be issued next (step S307). If burst termination is impossible for the transfer (NO in step S307), memory access is performed by issuing the READ A or WRITE A command to automatically perform precharge (step S309). If burst termination is possible (YES in step S307), memory access is performed by issuing the READ or WRITE command not to automatically perform precharge (step S310), and a burst termination command is issued at a timing at which the burst termination is possible (step S311). It is determined whether the transfer request queue (command queue) 107 is empty. If the transfer request queue 107 is not empty (NO in step S312), the process returns to step S301. If the transfer request queue 107 is empty (YES in step S312), the processing ends.

Whether burst termination is possible is determined based on the specifications of the DRAM device to be controlled, the burst length needed to actually transfer, and the burst length set in the DRAM device. If the burst length of the DRAM device is shorter than the memory access of the transfer request, and the DRAM device has the burst termination function, the burst termination is possible.

As described above, in this embodiment, only when issuance of the burst termination command is unnecessary, the command with precharge is used to perform memory access while avoiding loss of opportunity of burst termination. It is therefore possible to prevent the transfer efficiency from lowering.

Third Embodiment

Figure 4:
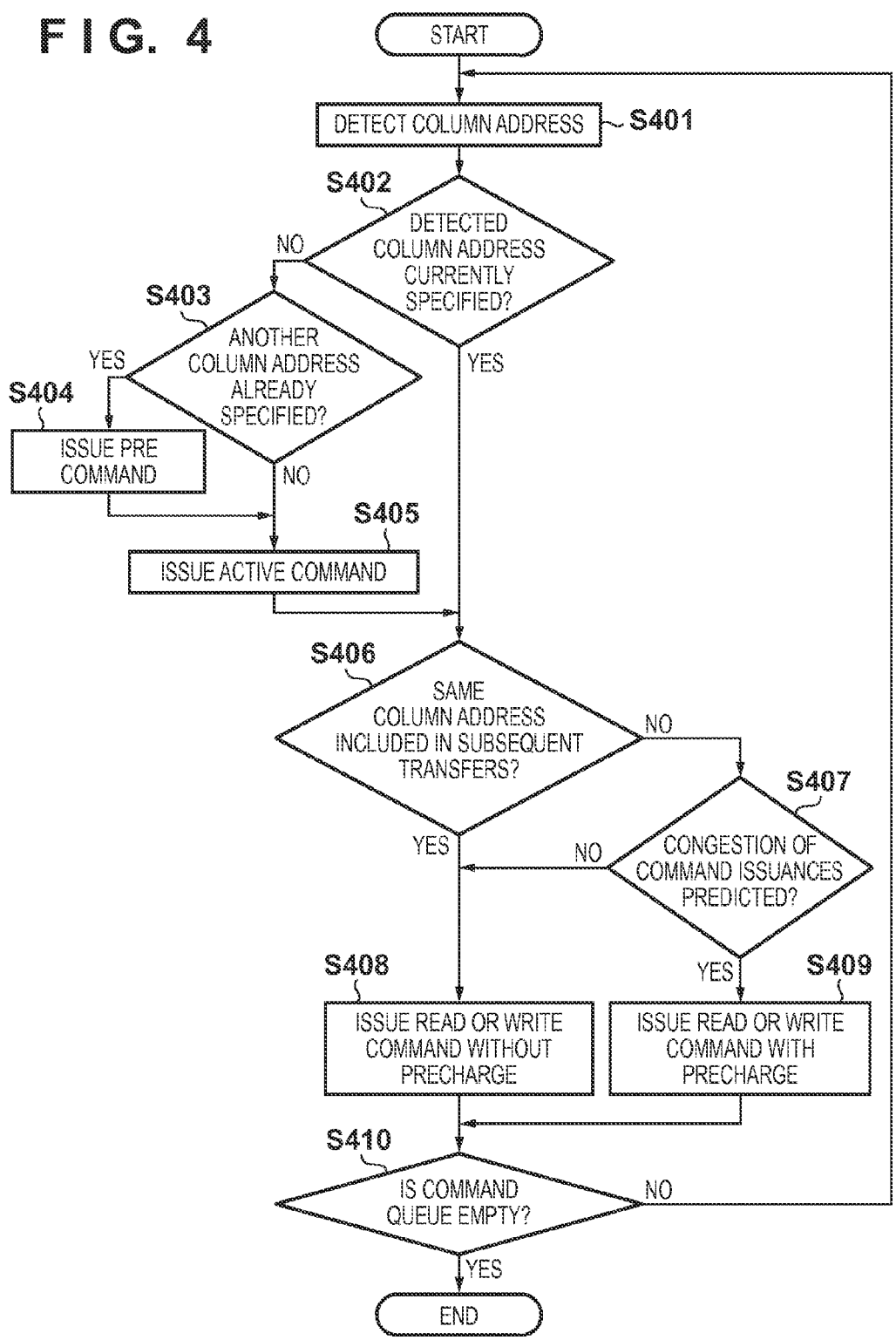
FIG. 4 is a flowchart showing the procedure of processing of a command issuance control unit.

FIG. 4 is a flowchart showing processing executed by command control units 103 to 106 according to this embodiment. Steps S401 to S405 of FIG. 4 are the same processes as steps S201 to S205 of FIG. 2, respectively. Processing from step S406 is different from the first embodiment. Hence, processing from step S406 will be described. When specifying the column address is completed, a subsequent transfer group stored in a transfer request queue 107 is confirmed (step S406). If the column addresses of the subsequent transfer requests include the same column address as the column address to be accessed next (YES in step S406), memory access is performed by issuing the READ or WRITE command not to automatically perform precharge (step S408). If the column addresses of the subsequent transfer requests do not include the same column address (NO in step S406), congestion of DRAM command issuances is predicted (step S407). If the DRAM commands are predicted not to congest (NO in step S407), memory access is performed by issuing the READ or WRITE command not to automatically perform precharge (step S408). If the DRAM commands are predicted to congest (YES in step S407), memory access is performed by issuing the READ A or WRITE A command (step S409). It is determined whether the transfer request queue (command queue) 107 is empty. If the transfer request queue 107 is not empty (NO in step S410), the process returns to step S401. If the transfer request queue 107 is empty (YES in step S410), the processing ends.

As for the prediction of congestion of DRAM command issuances, transfer requests stored in the transfer request queue 107 for each command control are confirmed, and the prediction can be done based on the number of transfer requests. The prediction can also be done by determining whether the number of transfers to different column addresses is large, or the number of transfers to the same column address is large in the transfer request queue 107. The prediction can also be done by comparing the number with a threshold or the like.

As described above, in this embodiment, the congestion of the DRAM command bus is monitored. In congestion with many command issuances, that is, only when issuance of the burst termination command is unnecessary, the command with precharge is used. This makes it possible to perform memory access while avoiding loss of opportunity of burst termination and prevent the transfer efficiency from lowering.

Fourth Embodiment

Figure 5:
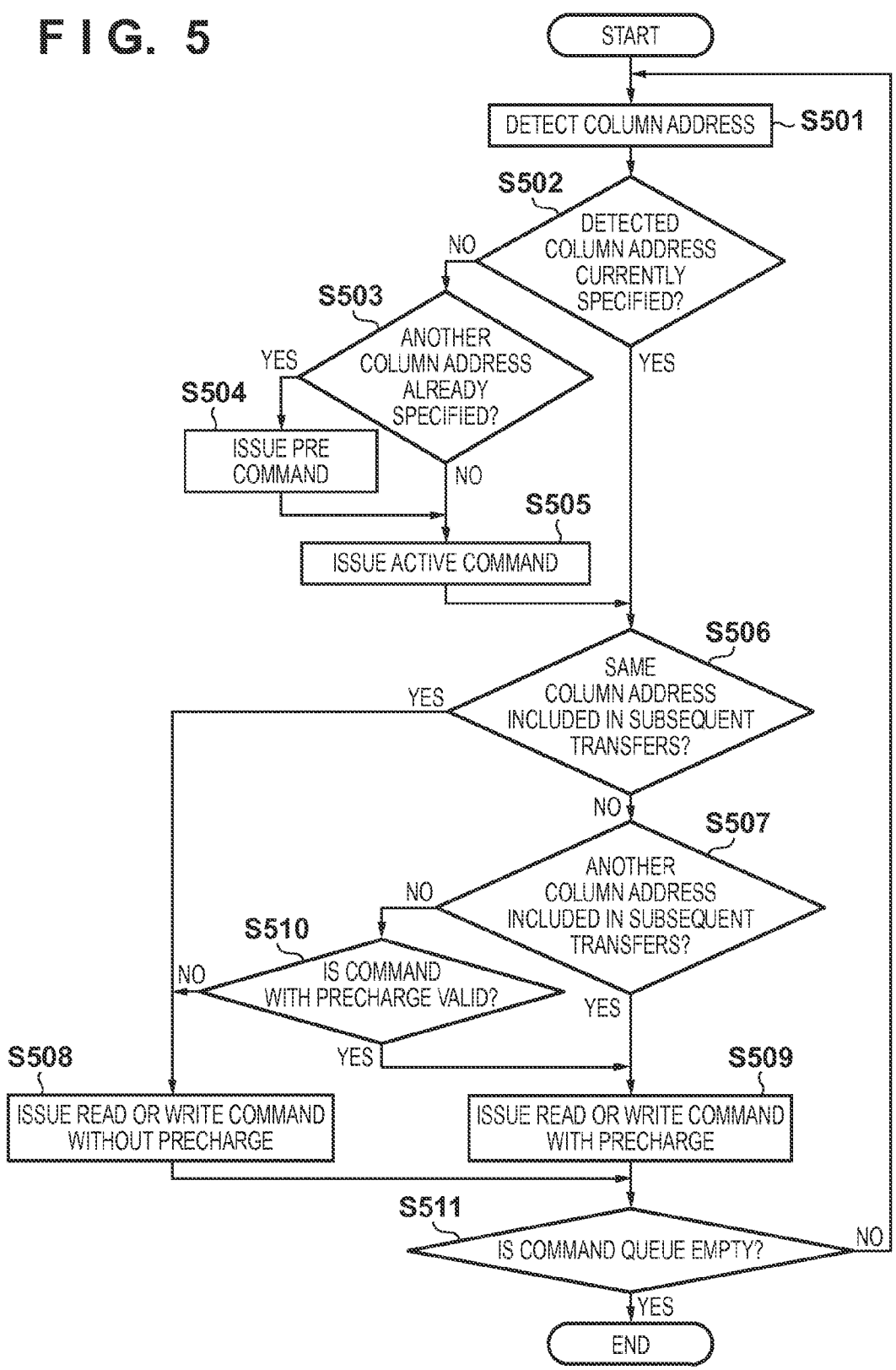
FIG. 5 is a flowchart showing the procedure of processing of a command issuance control unit.

FIG. 5 is a flowchart showing processing executed by command control units 103 to 106 according to this embodiment. Steps S501 to S505 of FIG. 5 are the same processes as steps S201 to S205 of FIG. 2, respectively. Processing from step S506 is different from the first embodiment. Hence, processing from step S506 will be described. When specifying the column address is completed, a subsequent transfer group stored in a transfer request queue 107 is confirmed (step S506). If the column addresses of the subsequent transfer requests include the same column address as the column address to be accessed next (YES in step S506), memory access is performed by issuing the READ or WRITE command not to automatically perform precharge (step S508). If the column addresses of the subsequent transfer requests do not include the same column address (NO in step S506), the subsequent transfers stored in the transfer request queue 107 include access to a column address different from that of the transfer to access (step S507). That is, it is confirmed whether the transfer request queue 107 is empty without subsequent access, or access to another column address exists. If access to another column address exists (YES in step S507), memory access is performed by issuing the READ A or WRITE A command to automatically perform precharge (step S509).

If the transfer request queue 107 is empty (NO in step S507), it is confirmed whether a setting to use a command with precharge is valid (step S510). This is because it is preferable to maintain the active state without precharge when the subsequent access is predicted to aim at the same page, or to inactivate the address by precharge when the access is predicted to aim at a different page. If the setting is valid (YES in step S510), memory access is performed by issuing the READ A or WRITE A command to automatically perform precharge (step S509). If the setting is not valid (NO in step S510), memory access is performed by issuing the READ or WRITE command not to automatically perform precharge (step S508). The means for determining whether the setting to use the command with precharge is valid is the same as that described concerning step S207 described above. It is determined whether the transfer request queue (command queue) 107 is empty. If the transfer request queue 107 is not empty (NO in step S511), the process returns to step S501. If the transfer request queue 107 is empty (YES in step S511), the processing ends.

As described above, in this embodiment, when no subsequent transfer request exists in the transfer request queue, issuance of the command with precharge is controlled, thereby suppressing lowering of the transfer efficiency.

Fifth Embodiment

Figure 6:
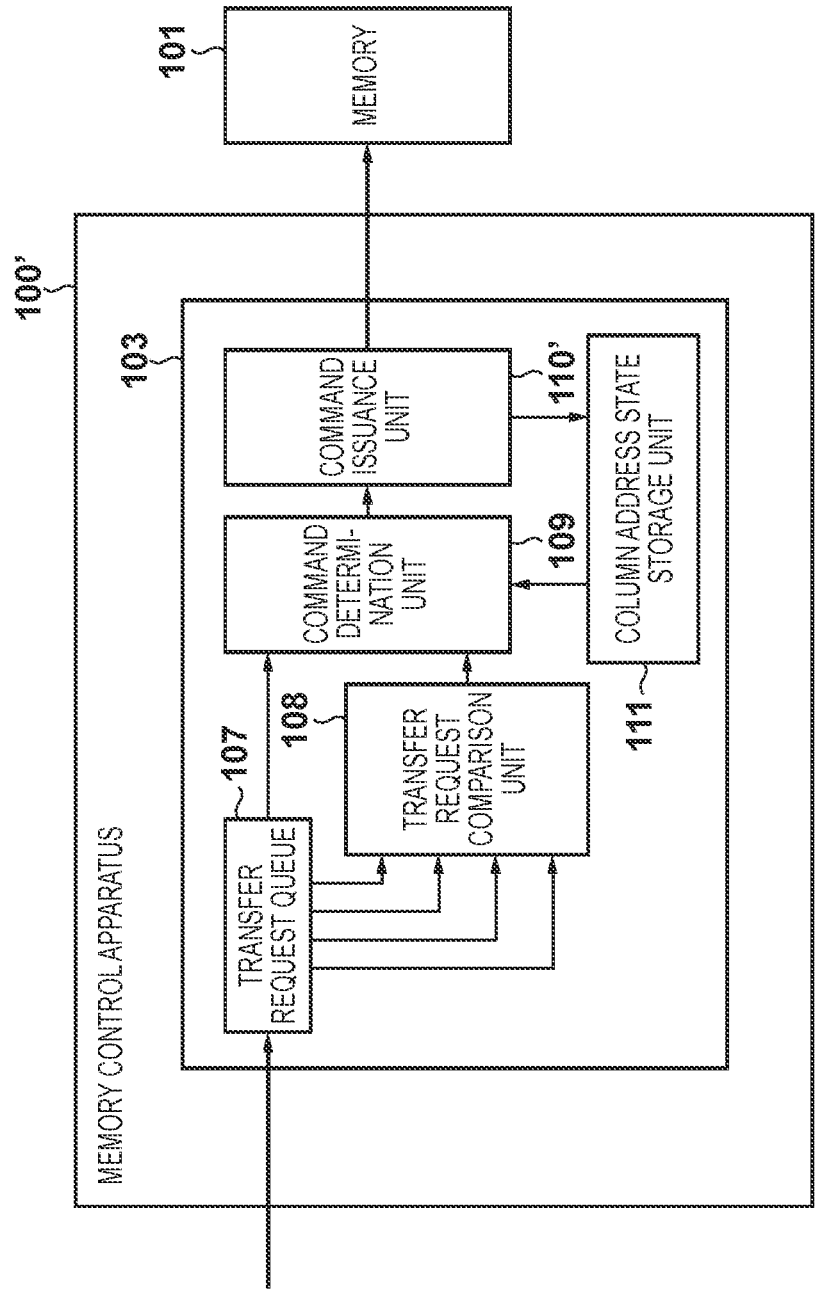
FIG. 6 is a block diagram showing the arrangement of a memory control apparatus.

In the above-described embodiments, an example has been described in which the transfer request assignment unit 102 assigns memory transfer requests to the command control units 103 to 106 for the respective banks to access, thereby controlling command issuance for each bank, as shown in FIG. 1. However, all memory transfer requests may be input to one command control unit without assigning them. FIG. 6 is a block diagram for explaining the schematic arrangement of a memory control apparatus 100' according to the fifth embodiment. In FIG. 6, the transfer request assignment unit 102 and the command control units 104 to 106 are removed, and all memory transfer requests are input to one command control unit, as compared to FIG. 1 (note that the CPU, ROM, and buses are not illustrated). The memory control apparatus according to this embodiment includes a command issuance unit 110' in place of the command issuance unit 110 shown in FIG. 1. The command issuance unit 110' issues a command for a transfer request to a corresponding bank. The rest of the operation is the same as that described in the first embodiment. In this embodiment, transfer requests to different banks coexist in a transfer request queue 107. However, occurrence of wasteful precharge is prevented by checking the plurality of requests in step S206.

As described in the above embodiments, according to the present invention, issuance of a command to perform precharge is adaptively controlled. This makes it possible to suppress occurrence of unnecessary precharge and suppress lowering of the transfer efficiency.

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-241103, filed Oct. 31, 2012, which is hereby incorporated by reference herein in its entirety.

What is claimed is:

1. A memory control apparatus for issuing a command to control a memory including a plurality of banks, comprising:
   a command control unit configured to, based on a transfer request which is input, issue a command for a bank corresponding to the transfer request,
   said command control unit comprising:
   at least one processor functioning as:
   a transfer request storage unit configured to store the transfer request for each bank;
   a transfer request comparison unit configured to compare a column address of a transfer request stored at a first location of said transfer request storage unit with column addresses of a plurality of subsequent transfer requests;
   a command determination unit configured to determine based on a comparison result of said transfer request comparison unit whether to issue a command with precharge or a command without precharge for the transfer request stored at the first location of said transfer request storage unit, wherein, when the column addresses of the plurality of subsequent transfer requests are different from the column address of the transfer request stored at the first location of said transfer request storage unit, said command determination unit determines to issue a command without precharge in a case where the transfer request stored at the first location of said transfer request storage unit is a transfer for which burst termination is possible, and said command determination unit determines to issue a command with precharge in a case where the transfer request stored at the first location of said transfer request storage unit is a transfer for which burst termination is prohibited; and
   a command issuance unit configured to issue the command determined by said command determination unit.

2. The apparatus according to claim 1, wherein when the column addresses of the plurality of subsequent transfer requests include the same column address as the column address of the transfer request stored at the first location of said transfer request storage unit, said command determination unit determines to issue the command without precharge, and when the column addresses of the plurality of subsequent transfer requests are different from the column address of the transfer request stored at the first location of said transfer request storage unit, said command determination unit determines, based on determining whether a setting of the command with precharge is valid, whether to issue the command with precharge or the command without precharge.

3. The apparatus according to claim 1, wherein when the column addresses of the plurality of subsequent transfer requests include the same column address as the column address of the transfer request stored at the first location of said transfer request storage unit, said command determination unit determines to issue the command without precharge, and when the column addresses of the plurality of subsequent transfer requests are different from the column address of the transfer request stored at the first location of said transfer request storage unit, said command determination unit determines, based on determining whether a command bus of the memory congests, whether to issue the command with precharge or the command without precharge.

4. The apparatus according to claim 3, wherein a congestion of the command bus is determined based on one of the number of transfer requests stored in said transfer request storage unit and the column address of the transfer request.

5. The apparatus according to claim 1, wherein when the column addresses of the plurality of subsequent transfer requests include the same column address as the column address of the transfer request stored at the first location of said transfer request storage unit, said command determination unit determines to issue the command without precharge, and when the column addresses of the plurality of subsequent transfer requests are different from the column address of the transfer request stored at the first location of said transfer request storage unit, said command determination unit determines, based on determining whether there is no subsequent transfer request, whether to issue the command with precharge or the command without precharge.

6. The apparatus according to claim 1, wherein said command issuance unit issues the command determined by said command determination unit only for a transfer request to a corresponding bank.

7. The apparatus according to claim 1, further comprising a transfer request assignment unit configured to assign the transfer request which is input to each bank and input the transfer request which is input to said command control unit corresponding to each bank.

8. The apparatus according to claim 1, further comprising a command selection unit configured to select one of commands issued by said command control unit corresponding to each bank and issue the command to control the memory.

9. The apparatus according to claim 1, further comprising a column address state storage unit configured to store a current selection state of the column address of the transfer request stored at the first location of said transfer request storage unit in the memory,
   wherein when the current selection state indicates no selection of the column address of the transfer request stored at the first of said transfer request storage unit, said command determination unit determines whether to issue a command to specify the column address of the transfer request stored at the first location of said transfer request storage unit or a command to inactivate the column address of the transfer request stored at the first location of said transfer request storage unit before determining whether to issue the command with precharge or the command without precharge.

10. The apparatus according to claim 1, wherein the memory comprises a DRAM.

11. The apparatus according to claim 1, wherein the column addresses of the plurality of subsequent transfer requests includes a column address of the transfer request stored at next to the first location of said transfer request storage unit and column addresses of the transfer requests followed by the transfer request stored at next to the first location of said transfer request storage unit, and,
   wherein said command determination unit determines to issue a command without precharge in a case where at least one of the column addresses of the plurality of subsequent transfer requests is the same as the column address of the transfer request stored at the first location of said transfer request storage unit,
   and, in a case where all of the column addresses of the plurality of subsequent transfer requests are different from the column address of the transfer request stored at the first location of said transfer request storage unit, said command determination unit determines to issue a command without precharge if the transfer request stored at the first location of said transfer request storage unit is a transfer for which burst termination is possible, and said command determination unit determines to issue a command with precharge if the transfer request stored at the first location of said transfer request storage unit is a transfer for which burst termination is prohibited.

12. A memory control apparatus for issuing, based on a transfer request which is input, a command for a bank indicated by the transfer request to control a memory including a plurality of banks, comprising:
at least one processor functioning as:
a reception unit configured to receive a plurality of transfer requests;
a command queue configured to store the plurality of transfer requests;
a comparison unit configured to compare a transfer request stored at a first location of said command queue with each of a plurality of subsequent transfer requests; and
an issuance unit configured to control, based on a comparison result of said comparison unit in accordance with whether, out of the plurality of subsequent transfer requests, a transfer request aiming at the same bank as the transfer request stored at the first location of said command queue specifies the same column as the transfer request at the first location of said command queue, whether to issue a command with precharge or a command without precharge, wherein, when the transfer request aiming at the same bank as the transfer request stored at the first location of said command queue specifies the same column as the transfer request at the first location of said command queue, said issuance unit issues a command without precharge in a case where the transfer request stored at the first location of said command queue is a transfer for which burst termination is possible, and said issuance unit issues a command with precharge in a case where the transfer request stored at the first location of said command queue is a transfer for which burst termination is prohibited.

13. The apparatus according to claim 12, wherein said issuance unit controls, based on the comparison result of said comparison unit in accordance with whether, out of the plurality of subsequent transfer requests, a transfer request aiming the same bank as the transfer request stored at the first location of said command queue and being close to the start of said command queue specifies the same column as the transfer request at the first location of said command queue, whether to issue the command with precharge or the command without precharge.

14. A memory control method of issuing, based on a transfer request which is input, a command for a bank corresponding to the transfer request, comprising:
a comparison step of comparing a column address of a transfer request stored at a first location of a transfer request storage unit configured to store the transfer request for the corresponding bank with each of column addresses of a plurality of subsequent transfer requests;
a determination step of determining based on a result of the comparison step, whether to issue a command with precharge or a command without precharge for the transfer request stored at the first location of the transfer request storage unit, wherein, when the column addresses of the plurality of subsequent transfer requests are different from the column address of the transfer request stored at the first location of said transfer request storage unit, it is determined to issue a command without precharge in a case where the transfer request stored at the first location of said transfer request storage unit is a transfer for which burst termination is possible, and it is determined to issue a command with precharge in a case where the transfer request stored at the first location of said transfer request storage unit is a transfer for which burst termination is prohibited; and
a step of issuing the command determined in the determination step.

15. An information processing apparatus including a memory including a plurality of banks, and a command queue configured to hold a plurality of transfer requests for said memory, the apparatus comprising:
at least one processor functioning as:
a comparison unit configured to compare a transfer request stored at a first location of said command queue with each of a plurality of subsequent transfer requests; and
a command issuance unit configured to issue a command with precharge based on a comparison result of said comparison unit, wherein, when column addresses of the plurality of subsequent transfer requests are different from a column address of the transfer request stored at the first location of said command queue, said command issuance unit issues a command without precharge in a case where the transfer request stored at the first location of said command queue is a transfer for which burst termination is possible, and said command issuance unit issues a command with precharge in a case where the transfer request stored at the first location of said command queue is a transfer for which burst termination is prohibited.

* * * * *